US010446424B2

(12) United States Patent
Wang et al.

(10) Patent No.: US 10,446,424 B2
(45) Date of Patent: Oct. 15, 2019

(54) STORAGE DEVICE AND PHOTORESIST COATING AND DEVELOPING MACHINE HAVING STORAGE DEVICE

(71) Applicants: BOE TECHNOLOGY GROUP CO., LTD., Beijing (CN); Chongqing BOE Optoelectronics Technology Co., Ltd., Chongqing (CN)

(72) Inventors: Zhichao Wang, Beijing (CN); Xiangyu Song, Beijing (CN); Yongbing Guan, Beijing (CN); Bingqiang Liu, Beijing (CN); Kun Cao, Beijing (CN)

(73) Assignees: BOE TECHNOLOGY GROUP CO., LTD., Beijing (CN); CHONGQING BOE OPTOELECTRONICS CO., LTD., Chongqing (CN)

( * ) Notice: Subject to any disclaimer, the term of this patent is extended or adjusted under 35 U.S.C. 154(b) by 0 days.

(21) Appl. No.: 15/575,811

(22) PCT Filed: Apr. 20, 2017

(86) PCT No.: PCT/CN2017/081243
§ 371 (c)(1),
(2) Date: Nov. 20, 2017

(87) PCT Pub. No.: WO2017/193788
PCT Pub. Date: Nov. 16, 2017

(65) Prior Publication Data
US 2018/0130682 A1     May 10, 2018

(30) Foreign Application Priority Data
May 11, 2016   (CN) .................... 2016 2 0433712 U

(51) Int. Cl.
*H01L 21/673*     (2006.01)
*G03F 7/16*     (2006.01)
*B65G 1/10*     (2006.01)

(52) U.S. Cl.
CPC ......... *H01L 21/67309* (2013.01); *B65G 1/10* (2013.01); *G03F 7/16* (2013.01)

(58) Field of Classification Search
CPC ............ H01L 21/67309; H01L 21/673; H01L 21/67303; H01L 21/67346; H01L 21/67751; B65G 1/10; B25H 3/00
See application file for complete search history.

(56) References Cited

U.S. PATENT DOCUMENTS

| 2004/0134831 A1* | 7/2004 | Huang ............... H01L 21/6734 206/711 |
| 2006/0032826 A1* | 2/2006 | Liu ..................... H01L 21/6734 211/41.18 |

(Continued)

FOREIGN PATENT DOCUMENTS

| CN | 202332810 U | 7/2012 |
| CN | 103057945 A | 4/2013 |

(Continued)

OTHER PUBLICATIONS

Machine translation of CN 105173429(A), retrieved on Apr. 10, 2018.*

(Continued)

*Primary Examiner* — Steven Whitesell Gordon
(74) *Attorney, Agent, or Firm* — Kinney & Lange, P.A.

(57) ABSTRACT

A storage device and a photoresist coating and developing machine having a storage device are disclosed. The storage device includes a frame and a plurality of layers of support plates disposed in sequence in the frame in a height direction of the frame, being used for receiving substrates to be exposed. The frame is provided with a plurality of layers of (Continued)

support members respectively associated with the plurality of layers of support plates, and each layer of the support plates is slidably mounted on the support member.

15 Claims, 3 Drawing Sheets

(56) References Cited

U.S. PATENT DOCUMENTS

| | | | | |
|---|---|---|---|---|
| 2006/0201423 A1* | 9/2006 | Akimoto | ............. | G03F 7/162 |
| | | | | 118/712 |
| 2006/0245848 A1* | 11/2006 | Wang | ............. | H01L 21/6734 |
| | | | | 414/217 |
| 2014/0037406 A1* | 2/2014 | Qi | ............. | B65G 1/10 |
| | | | | 414/277 |
| 2014/0042111 A1 | 2/2014 | Yang et al. | | |

FOREIGN PATENT DOCUMENTS

| | | |
|---|---|---|
| CN | 203046542 U | 7/2013 |
| CN | 105173429 A | 12/2015 |
| CN | 205608389 U | 9/2016 |
| KR | 20160009317 A | 1/2016 |
| TW | 201016574 A | 5/2010 |
| WO | WO-2012105785 A2 * | 8/2012 ....... H01L 21/67309 |

OTHER PUBLICATIONS

International Search Report and Box V of Written Opinion, for PCT Patent Application No. PCT/CN2017/081243, dated Jul. 26, 2017, 6 pages.

* cited by examiner

STORAGE DEVICE AND PHOTORESIST COATING AND DEVELOPING MACHINE HAVING STORAGE DEVICE

CROSS-REFERENCE TO RELATED APPLICATION

This application is a Section 371 National Stage Application of International Application No. PCT/CN2017/081243, filed on Apr. 20, 2017, entitled "STORAGE DEVICE AND PHOTORESIST COATING AND DEVELOPING MACHINE HAVING STORAGE DEVICE", which claims priority to Chinese Patent Application No. 201620433712.7 filed on May 11, 2016 with SIPO, incorporated herein by reference in entirety.

BACKGROUND

Technical Field

Embodiments of the present disclosure relate to a field of storage device or semiconductor manufacturing technology, and more particularly, to a storage device and a photoresist coating and developing machine having the storage device.

Description of the Related Art

In the manufacturing process of photoresist coating and developing in TFT-LCD industry, since the cost of the exposure equipment is very high, a storage device is provided in front of the exposure equipment for placing substrates therein, so as to avoid idleness of the exposure equipment. It is necessary to provide robot arms at both sides of the storage device to pick up and lay down the substrates, and there will be foreign objects in the exposure equipment after a long time use. The foreign objects will affect the exposure of the subsequent substrates if they are attached to the substrates. In order to avoid the storage device from affecting the exposure of the substrates, it needs regular maintenance of the storage device. The conventional storage devices are typically designed in such a way that a plurality of layers of fixing brackets are all fixed to four upright columns by screws, a plurality of support posts are provided above each layer of fixing bracket and the substrates are placed on the support posts. In this way, it needs to take a lot of time to disassemble and assemble them during the maintenance of the equipment, wastes a lot of manpower, and causes the exposure equipment left idle for a long time.

SUMMARY

An embodiment of the present disclosure provides a storage device, comprising a frame and a plurality of layers of support plates disposed in sequence in the frame in a height direction of the frame, the support plates being used for receiving substrates to be exposed, wherein the frame is provided with a plurality of layers of support members respectively associated with the plurality of layers of support plates, and each layer of the support plates is slidably mounted on the support member.

According to an embodiment of the present disclosure, a locking mechanism for fixing the support plates is provided at a side of the frame where the substrates are to be picked up.

According to an embodiment of the present disclosure, a position limiting plate is provided at a side of the frame opposite to the side where the locking mechanism is provided.

According to an embodiment of the present disclosure, the locking mechanism comprises a first screw hole provided in the frame, a second screw hole provided in the support plate, and a bolt cooperated with the first screw hole and the second screw hole.

According to an embodiment of the present disclosure, the locking mechanism comprises a front baffle plate fixed to the frame by a hinge.

According to an embodiment of the present disclosure, pulleys are provided below both sides of the support plate.

According to an embodiment of the present disclosure, the support member comprises first sliding chutes provided in the frame in parallel to a sliding direction of the support plate and cooperated with the pulleys.

According to an embodiment of the present disclosure, slide rails are provided on both sides of the support plate parallel to a sliding direction of the support plate, and the support member comprises second sliding chutes provided on both sides of the frame in parallel to the sliding direction of the support plate and cooperated with the slide rails.

According to an embodiment of the present disclosure, a plurality of support posts are provided on the support plate.

An embodiment of the present disclosure further provides a photoresist coating and developing machine, comprising the storage device according to any one of the above embodiments.

DETAILED DESCRIPTION OF PREFERRED EMBODIMENTS

In order to make the objectives, technical solutions, and advantages of the embodiments of the present disclosure more clear, the technical solutions in the embodiments of the present disclosure will be clearly and completely described below with reference to the accompanying drawings in the embodiments of the present disclosure. It is apparent that the described embodiments only represent a part of embodiments of the present disclosure, but do not represent all of the embodiments. All other embodiments obtained by those skilled in the art based on the embodiments of the present disclosure without creative efforts shall fall within the scope of the present disclosure.

The embodiments of the present disclosure are intended to at least partially solve the technical problem of inconvenient maintenance of the storage device in the related art.

Figure 1:
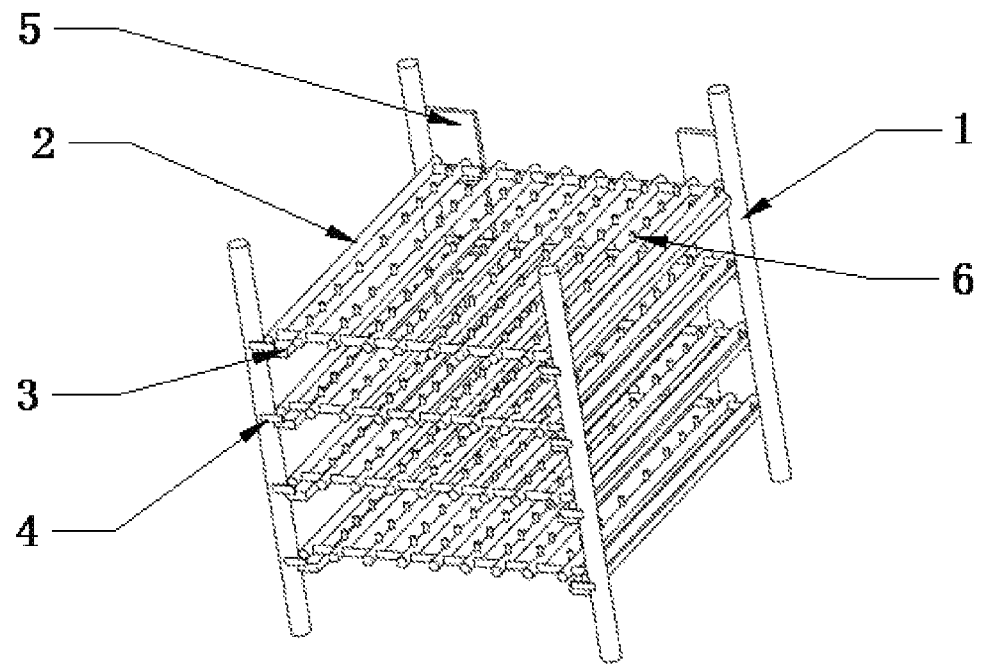
FIG. 1 is a three-dimensional schematic structural view of a storage device according to an embodiment of the present disclosure.
Figure 2:
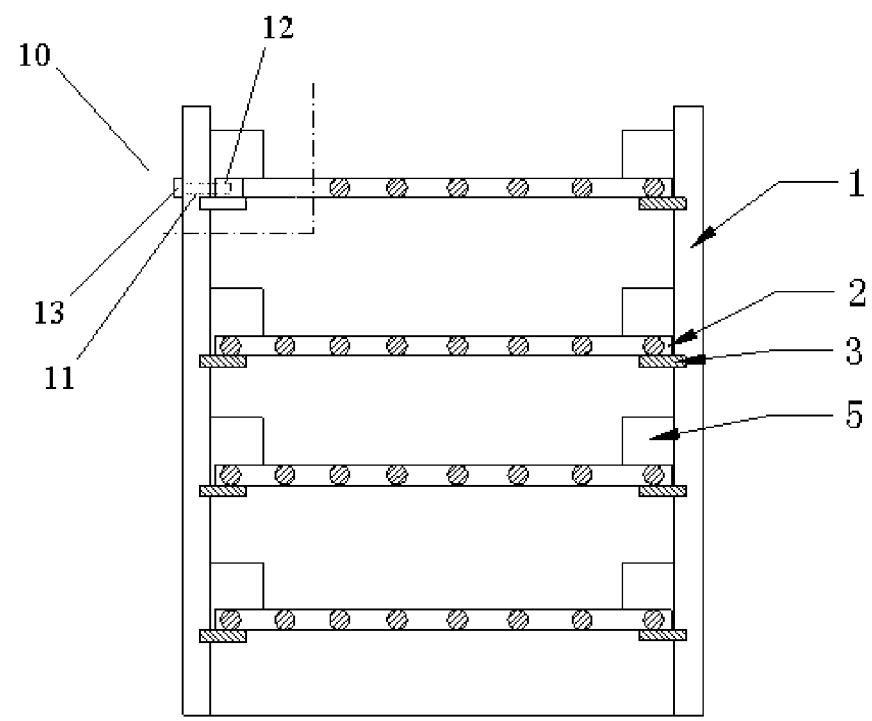
FIG. 2 is a front cross-sectional view of the storage device shown in FIG. 1.

As shown in FIGS. 1-2, the embodiment of the present disclosure provides a storage device, comprising a frame 1 and a plurality of layers of support plates 2 disposed in sequence in the frame 1 in a height direction of the frame, the support plates 2 being used for receiving substrates to be exposed. The frame 1 is provided with a plurality of layers of support members 3 respectively associated with the plurality of layers of support plates, and each layer of the support plates 2 is slidably mounted on the support member. When maintenance for the storage device is required, the support plate 2 may be directly taken off from the support member 3. Compared with the technical solution that all the support plates 2 are fixed to the frame 1 in the related art, the disassembling and assembling operations of the storage device become simple, the time required for the maintenance of the storage device is shortened, a long time idleness of the exposure equipment due to a long time period of maintenance is avoided, and the working efficiency is improved. Specifically, throughout an experiment in which a storage device with 19 layers of support plates 2 is taken as an example, the maintenance time can be shortened from 4 hours to less than 1.5 hours. Since it is possible to implement single-layer maintenance, the maintenance effect is better and it facilitates increasing the product yield.

The frame 1 may be formed from a plurality of upright columns (for example, four upright columns), the support plate 2 may be configured in a plate shape or combined by a plurality of rods, for example, the plurality of rods are spaced apart from each other, and arranged in parallel to each other and then combined together. Further, the support plate 2 may be composed of a plurality of transverse rods and a plurality of longitudinal rods perpendicular to the transverse rods.

Further, in this embodiment, a locking mechanism for fixing the support plates 2 is provided at a side of the frame 1 where the substrates are to be picked up. If the substrate is picked up by a robot arm, the substrate easily drives the support plate 2 to slide to a certain degree so that the support plate 2 moves out of the frame 1. Providing the locking mechanism at the side of the frame 1 where the substrates are picked up can limit the movement of the support plate, to avoid the support plate from moving out of the frame 1 when the substrate is picked up.

Further, in this embodiment, a position limiting plate 5 is provided at a side of the frame 1 opposite to the side where the locking mechanism is provided. Providing the position limiting plate 5 can limit the placement position of the support plate 2 when the support plate 2 is mounted.

Further, in this embodiment, the locking mechanism 10 comprises a first screw hole 11 provided in the frame 1, a second screw hole 12 provided in the support plate 2, and a bolt 13 cooperated with the first screw hole 11 and the second screw hole 12, as shown in FIG. 2, in which the top left corner is shown in a front view of FIG. 1. Since the support plate 2 is fixed to the frame 1 by the bolt, the fixing method is simple and reliable. Further, as shown in FIG. 1, the locking mechanism in this embodiment may also include a front baffle plate 4 fixed to the frame by a hinge. When maintenance is required, the support plate 2 can be drawn out by opening the front baffle plate 4. When the storage device is in use, the front baffle plate 4 is located at a side where the substrates are picked up, thereby functioning to fix the support plate 2.

Further, in this embodiment, a plurality of support posts 6 are provided on the support plate 2. When in use, the substrate is placed above the support posts 6 to facilitate picking up and storing the substrate.

Figure 3:
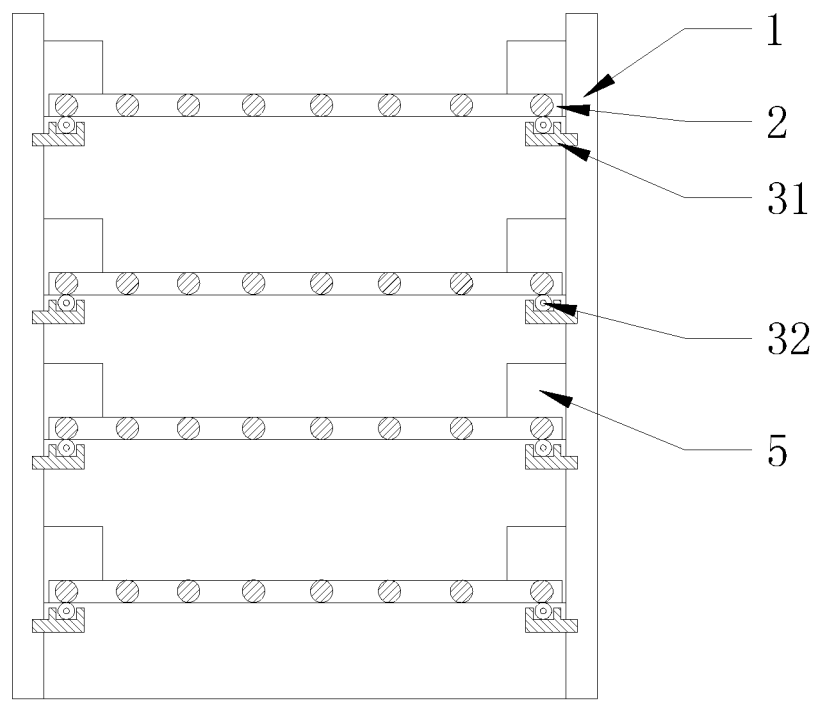
FIG. 3 is a front cross-sectional view of a storage device according to another embodiment of the present disclosure.

The same technical contents of the embodiment shown in FIG. 3 as the embodiment shown in FIGS. 1-2 will not be described repeatedly. The disclosure of the embodiment shown in FIGS. 1-2 also belongs to that of this embodiment. This embodiment focuses on further optimizing the specific technical feature that the support plate 2 is slidably mounted on the support member 3. In this embodiment, pulleys 32 are provided below both sides of the support plate 2. By providing the pulleys 32 below the support plate 2, the support plate 2 can be slid, reducing labor intensity of an operator. Further, in this embodiment, the support member 3 comprises first sliding chutes 31 provided in the frame 1 in parallel to a sliding direction of the support plate 2 and cooperated with the pulleys 32. Using the first sliding chute 31 as the support member 3, it not only plays the role of supporting the support plate 2, but also limits the movement of the pulley 32 in an extending direction of the first sliding chute 31, thereby the sliding of the support plate 2 in the frame 1 is more reliable. Specifically, the first sliding chute 31 may be configured in such a way that it includes a lower plate body and two upright plates extending upwards from the lower plate body, a slide passage is formed between the two upright plates, and the lower plate body is fixed to the frame 1.

Figure 4:
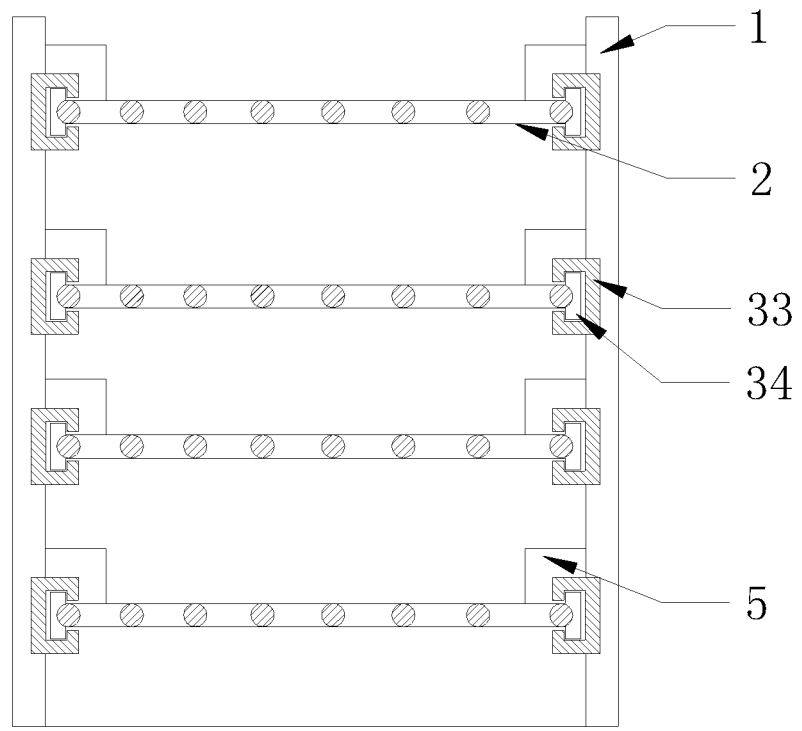
FIG. 4 is a front cross-sectional view of a storage device according to a further embodiment of the present disclosure.

The same technical contents of the embodiment shown in FIG. 4 as the embodiment shown in FIGS. 1-2 will not be described repeatedly. The disclosure of the embodiment shown in FIGS. 1-2 also belongs to that of this embodiment. This embodiment focuses on further optimizing the specific technical feature that the support plate 2 is slidably mounted on the support member 3. In this embodiment, slide rails 34 are provided on both sides of the support plate 2 parallel to the sliding direction of the support plate, and the support member 3 comprises second sliding chutes 33 provided on both sides of the frame in parallel to the sliding direction of the support plate 2 and cooperated with the slide rails 34. In this embodiment, a stable extraction and installation of the support plate 2 is realized by the cooperation of the slide rail 34 and the second sliding chute 33. Specifically, the second sliding chute 33 may be configured in such a way that: a cross section of the second sliding chute 33 perpendicular to a longitudinal extending direction of the second sliding chute 33 is substantially U-shaped, the second sliding chute 33 includes an opening, a bottom plate opposite to the opening, and two side plates, an accommodation space is formed inside the second sliding chute 33; in a mounted state of the support plate 2, the support plate 2 is sandwiched in the opening, and the slide rail 34 is accommodated in the accommodation space.

Figure 5:
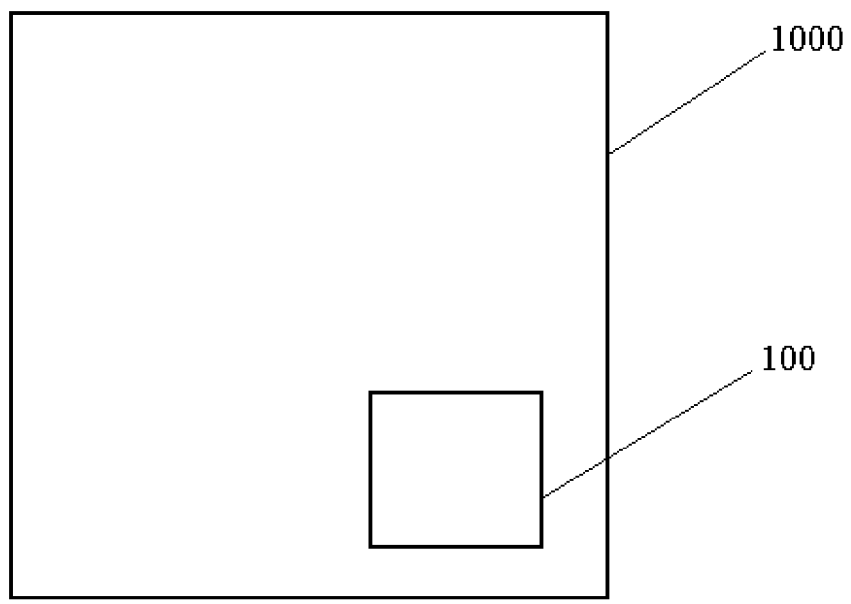
FIG. 5 is a schematic view of a photoresist coating and developing machine according to an embodiment of the present disclosure.

A further embodiment of the present disclosure provides a photoresist coating and developing machine 1000, comprising the storage device 100 according to any one of the above embodiments, referring to FIG. 5. By means of the above storage devices, it improves working efficiency of an operator, and thereby improves utilization rate of the entire photoresist coating and developing machine.

Compared with the related art, the above technical solutions of the embodiments of the present disclosure have the following advantages: the storage device according to the embodiments of the present disclosure is provided with support members, and the support plates are slidably mounted on the support members. When maintenance is required, the support plate may be directly taken off from the support member. Compared with the technical solution that all the support plates are fixed to the frame in the related art, the disassembling and assembling operations of the storage device become simple, the time required for the maintenance of the storage device is shortened, a long time idleness of the exposure equipment due to a long time period of maintenance is avoided, and the working efficiency is improved.

Finally, it should be noted that the above embodiments are merely intended for describing the technical solutions of the present disclosure, rather than limiting the present disclosure. Although the present disclosure is described in detail with reference to the foregoing embodiments, it should be understood by those skilled in the art that: modifications may be made to the technical solutions described in the foregoing embodiments, or equivalent replacements may be made to some technical features thereof. These modifications or replacements do not make the corresponding technical solutions in essence depart from the spirit and scope of the technical solutions in the embodiments of the present disclosure.

What is claimed is:

1. A storage device, comprising a frame and a plurality of layers of support plates disposed in sequence in the frame in a height direction of the frame, the support plates being used for receiving substrates to be exposed, wherein the frame is provided with a plurality of layers of support members respectively associated with the plurality of layers of support plates, and each layer of the support plates is slidably mounted on a respective support member, wherein the frame is formed from a plurality of upright columns, and the support plate is composed of a plurality of transverse rods and a plurality of longitudinal rods perpendicular to the transverse rods, wherein the plurality of transverse rods and the plurality of longitudinal rods are formed integrally and positioned in one and the same plane, wherein a locking mechanism for fixing the support plates is provided at a side of the frame where the substrates are to be picked up, wherein a position limiting plate is provided at a side of the frame opposite to the side where the locking mechanism is provided, and wherein a plurality of support posts are provided on each support plate.

2. The storage device according to claim 1, wherein the locking mechanism comprises a first screw hole provided in the frame, a second screw hole provided in the support plate, and a bolt cooperated with the first screw hole and the second screw hole.

3. The storage device according to claim 2, wherein pulleys are provided below both sides of each support plate, and wherein each support member comprises first sliding chutes provided in the frame in parallel to a sliding direction of the support plate and cooperated with the pulleys.

4. The storage device according to claim 3, wherein each first sliding chute comprises a lower plate body and two upright plates extending upwards from the lower plate body, a slide passage is formed between the two upright plates, and the lower plate body is fixed to the frame.

5. The storage device according to claim 2, wherein slide rails are provided on both sides of each support plate parallel to a sliding direction of the support plate, and each support member comprises second sliding chutes provided on both sides of the frame in parallel to the sliding direction of the support plate and cooperated with the slide rails.

6. The storage device according to claim 1, wherein the locking mechanism comprises a front baffle plate fixed to the frame by a hinge.

7. The storage device according to claim 1, wherein pulleys are provided below both sides of each support plate.

8. The storage device according to claim 7, wherein each support member comprises first sliding chutes provided in the frame in parallel to a sliding direction of each support plate and cooperated with the pulleys.

9. The storage device according to claim 8, wherein four support posts are provided on each support plate.

10. The storage device according to claim 8, wherein each first sliding chute comprises a lower plate body and two upright plates extending upwards from the lower plate body, a slide passage is formed between the two upright plates, and the lower plate body is fixed to the frame.

11. The storage device according to claim 8, wherein each first sliding chute comprises a lower plate body and two upright plates extending upwards from the lower plate body, a slide passage is formed between the two upright plates, and the lower plate body is fixed to the frame.

12. The storage device according to claim 1, wherein slide rails are provided on both sides of each support plate parallel to a sliding direction of the support plate, and each support member comprises second sliding chutes provided on both sides of the frame in parallel to the sliding direction of the support plate and cooperated with the slide rails.

13. The storage device according to claim 12, wherein a cross section of each second sliding chute perpendicular to a longitudinal extending direction of the second sliding chute is U-shaped, the second sliding chute comprises an opening, a bottom plate opposite to the opening, and two side plates, and an accommodation space is formed inside the second sliding chute; wherein in a mounted state of the support plate, the support plate is sandwiched in the opening, and the slide rail is accommodated in the accommodation space.

14. A photoresist coating and developing machine, comprising the storage device according to claim 1.

15. The storage device according to claim 1, wherein four support posts are provided on each support plate.

* * * * *